United States Patent
Wang et al.

(10) Patent No.: US 11,561,862 B2
(45) Date of Patent: Jan. 24, 2023

(54) REFRESH MANAGEMENT FOR DRAM

(71) Applicant: Advanced Micro Devices, Inc., Santa Clara, CA (US)

(72) Inventors: Jing Wang, Austin, TX (US); James R. Magro, Lakeway, TX (US); Kedarnath Balakrishnan, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 194 days.

(21) Appl. No.: 16/887,904

(22) Filed: May 29, 2020

(65) Prior Publication Data
US 2021/0374006 A1 Dec. 2, 2021

(51) Int. Cl.
*G06F 11/00* (2006.01)
*G06F 11/14* (2006.01)
*G11C 11/406* (2006.01)

(52) U.S. Cl.
CPC ........ *G06F 11/1443* (2013.01); *G11C 11/406* (2013.01); *G11C 11/40618* (2013.01); *G06F 2201/805* (2013.01)

(58) Field of Classification Search
CPC ............. G06F 11/1068; G06F 11/1048; G06F 11/076; G06F 11/108; G06F 11/0793; G06F 11/08; G06F 11/1438
See application file for complete search history.

(56) References Cited

U.S. PATENT DOCUMENTS

| 9,293,188 B2 | 3/2016 | Brandl |
| 10,403,333 B2 | 9/2019 | Brandl et al. |
| 11,049,544 B2 | 6/2021 | Devaux et al. |
| 2014/0006703 A1 | 1/2014 | Bains et al. |

(Continued)

FOREIGN PATENT DOCUMENTS

KR 10-2020-0014805 A 2/2020

OTHER PUBLICATIONS

International Search Report and Written Opinion for International Application No. PCT/US2021/034068, dated Sep. 10, 2021, 8 pages.

(Continued)

*Primary Examiner* — Charles Ehne
(74) *Attorney, Agent, or Firm* — Polansky & Associates, P.L.L.C.; Paul J. Polansky; Nathan H. Calvert

(57) ABSTRACT

A memory controller interfaces with a dynamic random access memory (DRAM). The memory controller selectively places memory commands in a memory interface queue, and transmits the commands from the memory interface queue to a memory channel connected to at least one dynamic random access memory (DRAM). The transmitted commands are stored in a replay queue. A number of activate commands to a memory region of the DRAM is counted. Based on this count, a refresh control circuit signals that an urgent refresh command should be sent to the memory region. In response to detecting a designated type of error, a recovery sequence initiates to re-transmit memory commands from the replay queue. Designated error conditions can cause the recovery sequence to restart. If an urgent refresh command is pending when such a restart occurs, the recovery sequence is interrupted to allow the urgent refresh command to be sent.

30 Claims, 6 Drawing Sheets

(56) References Cited

U.S. PATENT DOCUMENTS

| | | |
|---|---|---|
| 2014/0059287 A1 | 2/2014 | Bains et al. |
| 2014/0095780 A1 | 4/2014 | Bains et al. |
| 2016/0224243 A1 | 8/2016 | Son et al. |
| 2017/0117030 A1 | 4/2017 | Fisch et al. |
| 2018/0018221 A1 | 1/2018 | Magro et al. |
| 2019/0228813 A1 | 7/2019 | Nale et al. |
| 2020/0019458 A1* | 1/2020 | Cadloni ............... G11C 29/52 |
| 2020/0020384 A1* | 1/2020 | Zhao ............... G11C 11/40611 |
| 2020/0097359 A1* | 3/2020 | O'Connor ............ G11C 11/406 |
| 2021/0358540 A1* | 11/2021 | Brandl ............ G11C 11/40615 |

OTHER PUBLICATIONS

Jedec Standard; Low Power Double Data Rate 4 (LPDDR4); JESD209-4A—a Revision of JESD209-4, Aug. 2014; JEDEC Solid State Technology Association, 3103 North 10th Street, Suite 240 South, Arlington, VA 22201, United States; Nov. 2015; 8 pages.

* cited by examiner

REFRESH MANAGEMENT FOR DRAM

BACKGROUND

Computer systems typically use inexpensive and high-density dynamic random access memory (DRAM) chips for main memory. When a particular row in a DRAM chip is activated for reading or writing, the word line associated with the row is activated, and the contents of the memory cells along the row are read into a page buffer. Subsequent read and write accesses to memory cells in the row can take place wholly within the page buffer, without accessing the row again. When a data processor later accesses another row in the same memory bank, the memory cells along the row are restored in a precharge operation before the other row can be activated.

Modern DRAM chips typically store one to eight gigabits (Gb) of data using deep sub-micron technology. Because of the high density and small feature size, rows of the memory are so physically close to other rows that the activation of a particular row can upset data stored in adjacent rows by changing the charge on the memory cell capacitors. In the past, these upsets were typically harmless because the memory cells are refreshed periodically. However, occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles. As feature sizes become smaller, this problem, known as "row hammer", becomes harder to mitigate because the number of row activates required to cause the problem becomes smaller.

One known technique to address the data upset problem is known as targeted row refresh (TRR). In order to ensure that a DRAM row is not activated too many times within a refresh period, a memory controller places the DRAM into a TRR mode by setting certain mode register bits. The controller then issues successive activate and precharge commands to the target row as well as the two physically adjacent rows. Once TRR mode is enabled, no other mode register commands are allowed until the TRR mode is completed. TRR mode is self-clearing and the mode register bit is set after the completion of TRR mode. While TRR allows the memory controller to avoid excessive activates to a certain row within a certain time period, it is entered by setting the mode register, which requires a substantial amount of time since all banks must be in the idle state before the controller can issue a Mode Register Set command.

Figure 1:
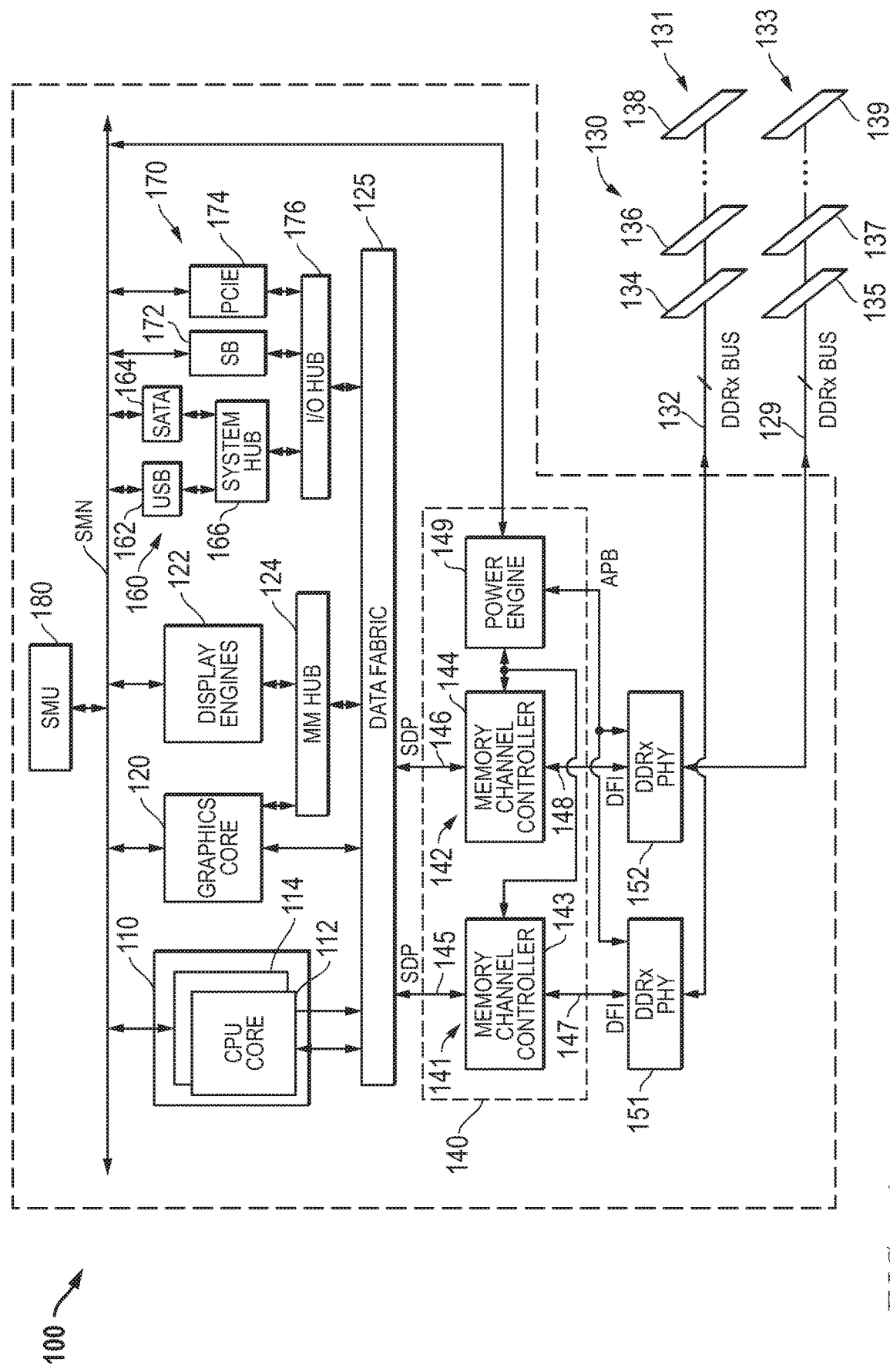
FIG. 1 illustrates in block diagram form an accelerated processing unit (APU) and memory system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a memory interface queue, an arbiter, at least one replay queue, a refresh control circuit, and a replay control circuit. The memory interface queue includes an output for connecting to a memory channel adapted for connecting to at least one dynamic random access memory (DRAM). The arbiter is connected to the memory interface queue for selecting incoming memory commands and placing them in the memory interface queue causing them to be transmitted over the memory channel. The replay queue stores memory access commands that are placed in the memory interface queue. The refresh control circuit is connected to the arbiter and operable to monitor an activate counter which counts a number of activate commands sent over the memory channel to a memory region, and in response to the activate counter being above a designated threshold, signal the arbiter that an urgent refresh command should be sent. The replay control circuit detects that a designated type of error has occurred, and in response to the error, initiates a recovery sequence including re-transmitting selected memory commands from the at least one replay queue.

A method includes selectively placing memory commands in a memory interface queue, transmitting the memory commands from the memory interface queue to a memory channel connected to at least one dynamic random access memory (DRAM), and storing a copy of the transmitted memory commands in a replay queue. The method counts a number of activate commands sent over the memory channel to a memory region of the DRAM. In response to the number of activate commands being above a designated threshold value, the method signals an arbiter that an urgent refresh command should be sent to the memory region. In response to detecting that a designated type of error has occurred, the method initiates a recovery sequence including re-transmitting selected memory commands from the replay queue. In response to designated error conditions in the recovery sequence, the method checks whether an urgent refresh command is pending at the arbiter and, and, if so, interrupts the recovery sequence and allows the urgent refresh command to be sent.

A data processing system includes a data processor, a data fabric connected to the data processor, and a memory controller connected to the data fabric for fulfilling memory requests from data processor. The memory controller includes a memory interface queue, an arbiter, at least one replay queue, a refresh control circuit, and a replay control circuit. The memory interface queue includes an output for connecting to a memory channel adapted for connecting to at least one dynamic random access memory (DRAM). The arbiter is connected to the memory interface queue for selecting incoming memory commands and placing them in the memory interface queue causing them to be transmitted over the memory channel. The replay queue stores memory access commands that are placed in the memory interface queue. The refresh control circuit is connected to the arbiter and operable to monitor an activate counter which counts a number of activate commands sent over the memory channel to a memory region, and in response to the activate counter being above a designated threshold, signal the arbiter that an urgent refresh command should be sent. The replay control circuit detects that a designated type of error has occurred, and in response to the error, initiates a recovery sequence including re-transmitting selected memory commands from the at least one replay queue.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180. As will be appreciated by a person of ordinary skill APU 100 may not have all of these elements present in every embodiment and, further, may have additional elements included therein. Furthermore, APU 100 may comprise one or multiple integrated circuits in, for example, a system.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
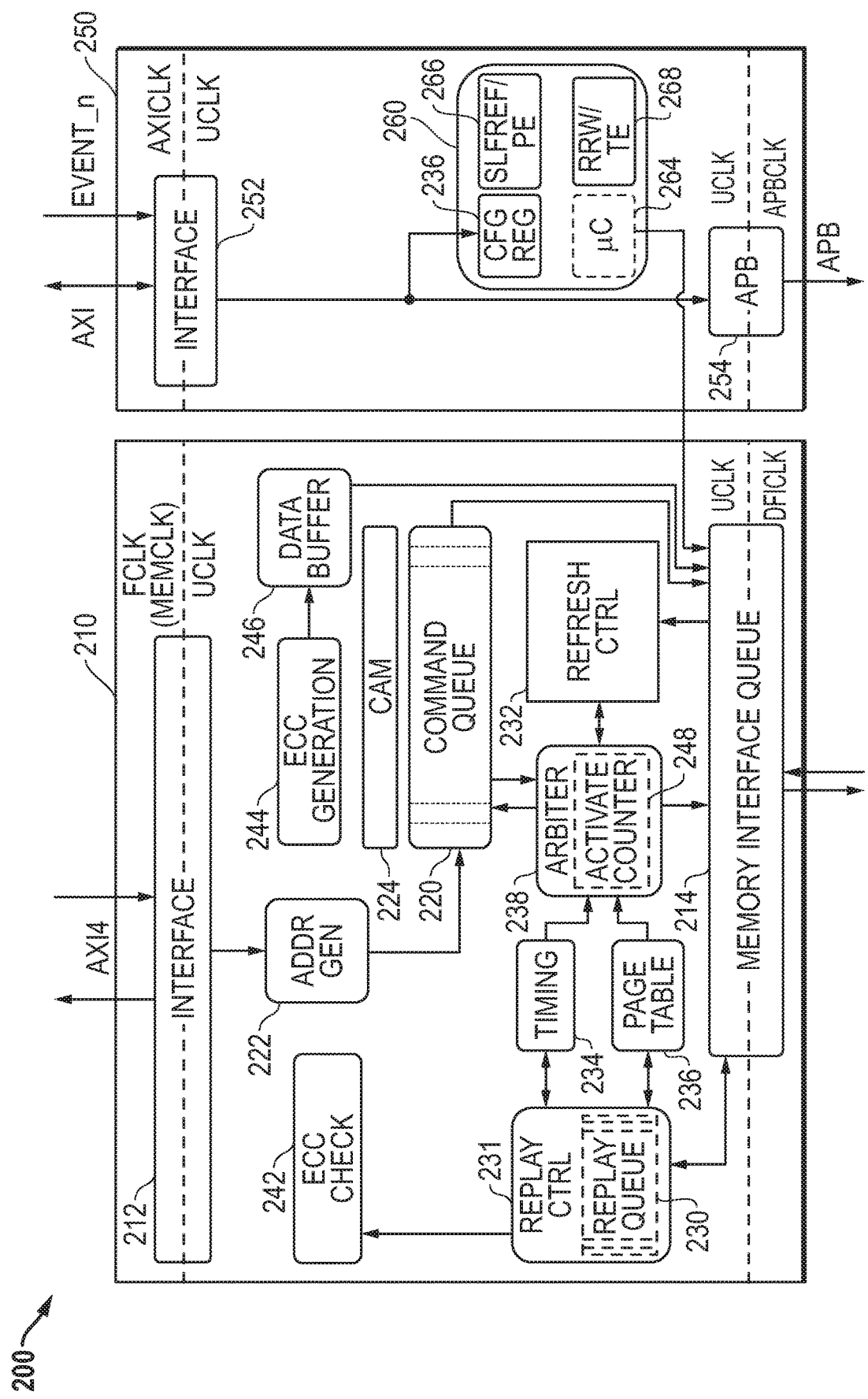
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh logic block 232, a timing block 234, a page table 236, an arbiter 238, an error correction code (ECC) check circuit 242, an ECC generation block 244, and a data buffer 246.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a recovery sequence in which accesses are replayed in the case of a parity or ECC error of one of these cycles. Replayed commands are placed in the memory interface queue 214.

Refresh control logic 232 includes state machines for various power down, refresh, and termination resistance (ZQ) calibration cycles that are generated separately from normal read and write memory access requests received from memory accessing agents. For example, if a memory rank is in precharge power down, it must be periodically awakened to run refresh cycles. Refresh control logic 232 generates refresh commands periodically and in response to designated conditions to prevent data errors caused by leaking of charge off storage capacitors of memory cells in DRAM chips. The memory regions are memory banks in some embodiments, and memory sub-banks in other embodiments as further discussed below. Refresh control logic 232 also generates refresh commands, which include both refresh (REF) commands and refresh management (RFM) commands, in which the RFM commands direct the memory to perform refresh functions for mitigating row hammer issues as further described below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210. Arbiter 238 improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "tRc". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230. Arbiter 238 includes an activate counter 248, which in this embodiment includes a counter for each memory region which counts a number of activate commands sent over the memory channel to a memory region. Arbiter 238 is bidirectionally connected to refresh control logic 232 to monitor refresh commands and direct refresh activities.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (μC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Figure 3:
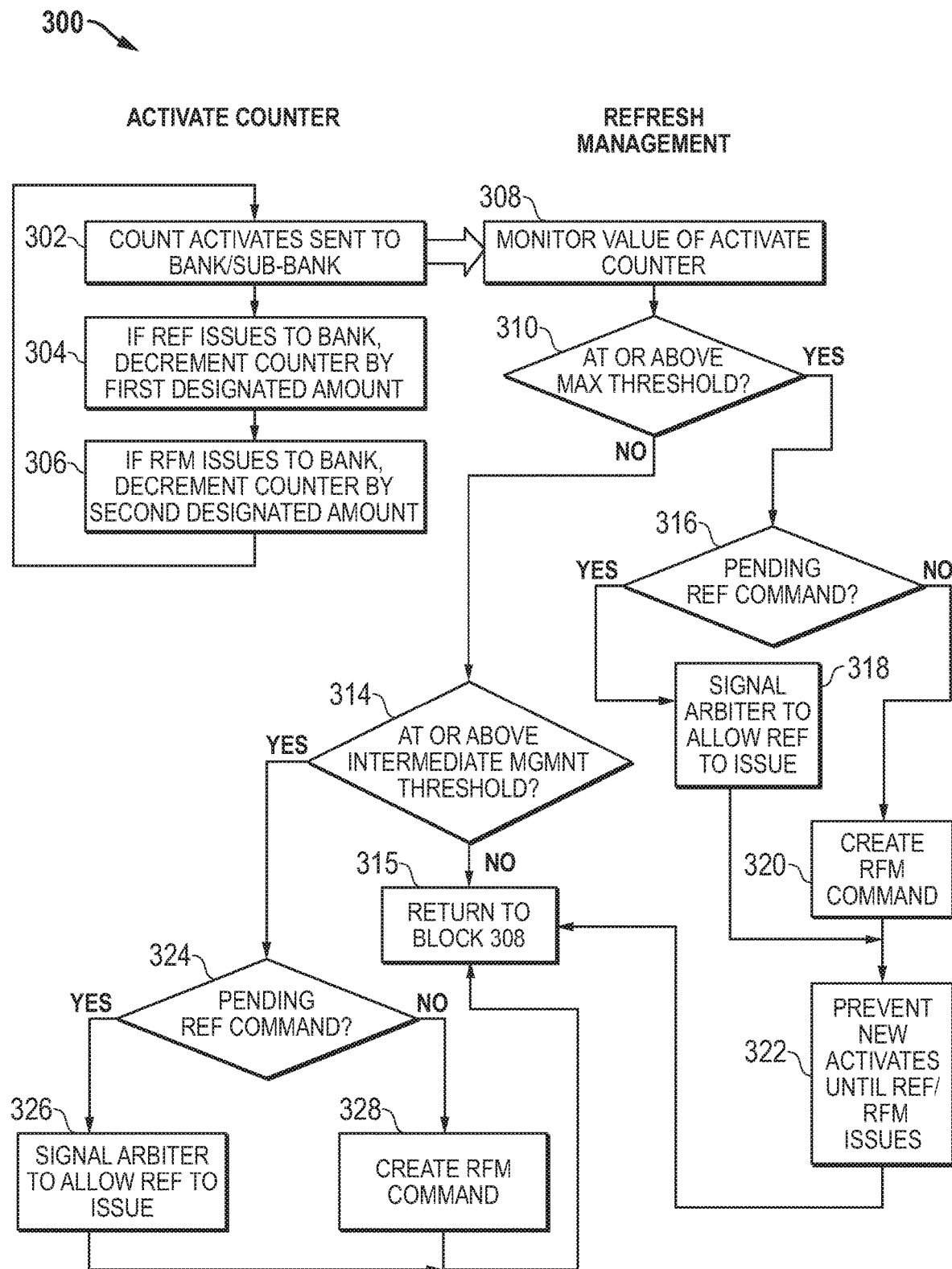
FIG. 3 is a flow diagram of a process for handling refresh management according to some embodiments.

FIG. 3 is a flow diagram of a process 300 for handling refresh management according to some embodiments. Process 300 is performed by refresh control logic 232 (FIG. 2) in some embodiments, and or by memory controller digital logic or a controller having similar functionality in other embodiments. In this embodiment, refresh control logic 232 is connected to arbiter 238 and operates to monitor activate counter 248, which counts a number of activate commands sent over the memory channel to a memory region as shown at block 302. The memory regions are memory banks in some embodiments, but are memory sub-banks in other embodiments as further discussed below. Process 300 is repeated for each memory region. At block 304, process 300 manages the counter by decrementing the counter by a first designated amount if a refresh (REF) command issues to the respective monitored region. Block 304 accounts for "per bank" REF commands which are directed to particular memory banks, and "all bank" REF commands which are directed to all the banks in a particular memory rank. For example, an activate counter for a memory bank is decremented by 50 in response to an REF command being issued to the memory bank in one embodiment, whether it is a per bank REF or an all bank REF. As such, an all bank REF command causes multiple activate counters to be decremented, for all the affected banks. Process 300 also accounts for issuance of refresh management (RFM) commands by decrementing the counter by a second designated amount when an RFM command issues to the memory region, as shown at block 306. For example, the activate counter for a memory banks is decremented by 100 in response to an RFM command issuing to the memory bank in one embodiment. As will be appreciated, the amounts of decrement (or increment) are exemplary and other values could be employed. Furthermore, the first amount, a per region or, as described with reference to the exemplary embodiment, the per bank amount, and/or the second amount (the all bank amount in the exemplary embodiment) could be dynamically changed to reflect various characteristics of the memory device—e.g., aging, voltage, temperature, etc.—that may affect how frequently the memory requires to be refreshed.

While activate counter 248 is updated by blocks 302, 304, and 306, the value is monitored by process 300 as shown at blocks 308-320, which take various refresh management actions in addition to the normal REF commands which issue to the memory region. Generally, process 300 works to provide a refresh command of some type (REF or RFM), while preferring REF commands created by periodic refresh functions of refresh control logic 232 (FIG. 2). This preference is accomplished by, in response to the activate counter being above an intermediate management threshold value and below a maximum management threshold value, determining if a pending refresh (REF) command is currently held at the refresh control circuit for the memory region and, if not, causing a refresh management (RFM) command to be sent to the memory region. If so, the pending REF command is allowed to issue with no RFM command being issued. In response to the activate counter being at or above the maximum management threshold, the process causes an RFM command to be scheduled for the memory region, and prevents any new activate commands from being scheduled to the memory region until the RFM command is scheduled or a pending REF command is scheduled. Different logical processes are used to accomplish this in different embodiments.

In the depicted process 300, block 308 monitors the value of activate counter 248. If the value is at or above a maximum management threshold at block 310, process 300 goes to block 316 where it checks if an REF command is pending at arbiter 238 for the memory region. Block 316 checks for "per bank" REF commands and "all bank" REF commands that apply to the bank in question. If one of either type REF commands is pending which covers the bank in question, the process goes to block 318 where it signals the arbiter to prioritize the pending REF command to require it to be scheduled and issued. If no pending REF command is found at block 316, process 300 goes to block 320, where it creates a new RFM command to be scheduled by the arbiter. After either of blocks 318 or 320, process 300 goes to block 322 where it prevents any activate commands being scheduled at arbiter 238 until either the newly-created RFM command is scheduled or a pending REF is scheduled. In some alternative embodiments, the refresh control circuit is further operable to, in response to a designated condition of activate counter 248 such as crossing the maximum threshold at block 310, cause a refresh rate to double for the memory region until the designated condition is remedied. Such a rate increase may be performed in addition to or instead of creating an RFM command at block 320. In some embodiments, the refresh control logic is configurable to include the rate increase.

If activate counter 248 is not above the maximum management threshold at block 310, block 314 checks if activate counter 248 is at or above the intermediate management threshold. If not, block 315 simply returns to block 308 to continue monitoring the activate counter. If so, process 300 goes to block 324 where it checks if an REF command is pending at arbiter 238 for the memory region. Block 316 checks for "per bank" REF commands and "all bank" REF commands that apply to the bank in question. If one of either type REF commands is pending which covers the bank in question, the process goes to block 326 where it signals the arbiter to prioritize the pending REF command to require it to be scheduled and issued. If not, process 300 goes to block 328, where it creates a new RFM command to be scheduled by the arbiter.

While the depicted process blocks are shown in order, this order is not limiting, and the depicted logical functionality, or its logical equivalent, is typically accomplished by various digital logic circuits operating in parallel. In various embodiments, digital logic circuits perform the activate counter monitoring in various ways, such as by responding to changes in the activate counter or repeatedly comparing the activate counter value to one or both of the intermediate threshold value and the maximum threshold value. The monitoring at block 308 continues after each depicted branch of logical functionality is finished.

The intermediate management threshold and the maximum management threshold are preferably adjustable to allow the memory controller to work well with different DRAM modules from various manufacturers, for which REF and RFM commands often vary in their implementation. In some embodiments, the intermediate management threshold and the maximum management threshold are allowed to be set to the same value to implement a simplified version of the monitoring process. Setting these two threshold values to be equal preferably functions to disable the maximum management threshold logic (block 310), and allow the logic implementing the intermediate management threshold comparison (blocks 314, 315, 324, 326, and 328) to handle situations in which the counter exceeds the equal threshold values. Such implementations thereby function to prefer pending REF commands when they exist rather than creating new RFM commands. This preference often improves efficiency because REF commands are often faster than RFM commands among various DRAM module implementations.

In various embodiments, the memory region for which an activate counter is monitored is a memory bank or a sub-bank. When the memory region is a sub-bank of a memory bank, and the refresh control circuit is operable to monitor multiple activate counters for respective multiple sub-banks of the memory bank and apply REF and RFM commands at the bank level. Such commands cause an update of all the sub-bank activate counters for sub-banks within the bank. Similarly, all bank REF commands cause an update of sub-bank activate counters for all sub-banks within the respective rank. As such, process 300 is operable to monitor the activate counters at a granularity level of the multiple sub-banks, and allow or cause the REF and RFM commands to issue at a granularity level of the selected memory bank. The refresh control circuit may be configurable to provide activate counters for memory banks or sub-banks, with the refresh management process also adjustable to account for banks or sub-banks.

Figure 4:
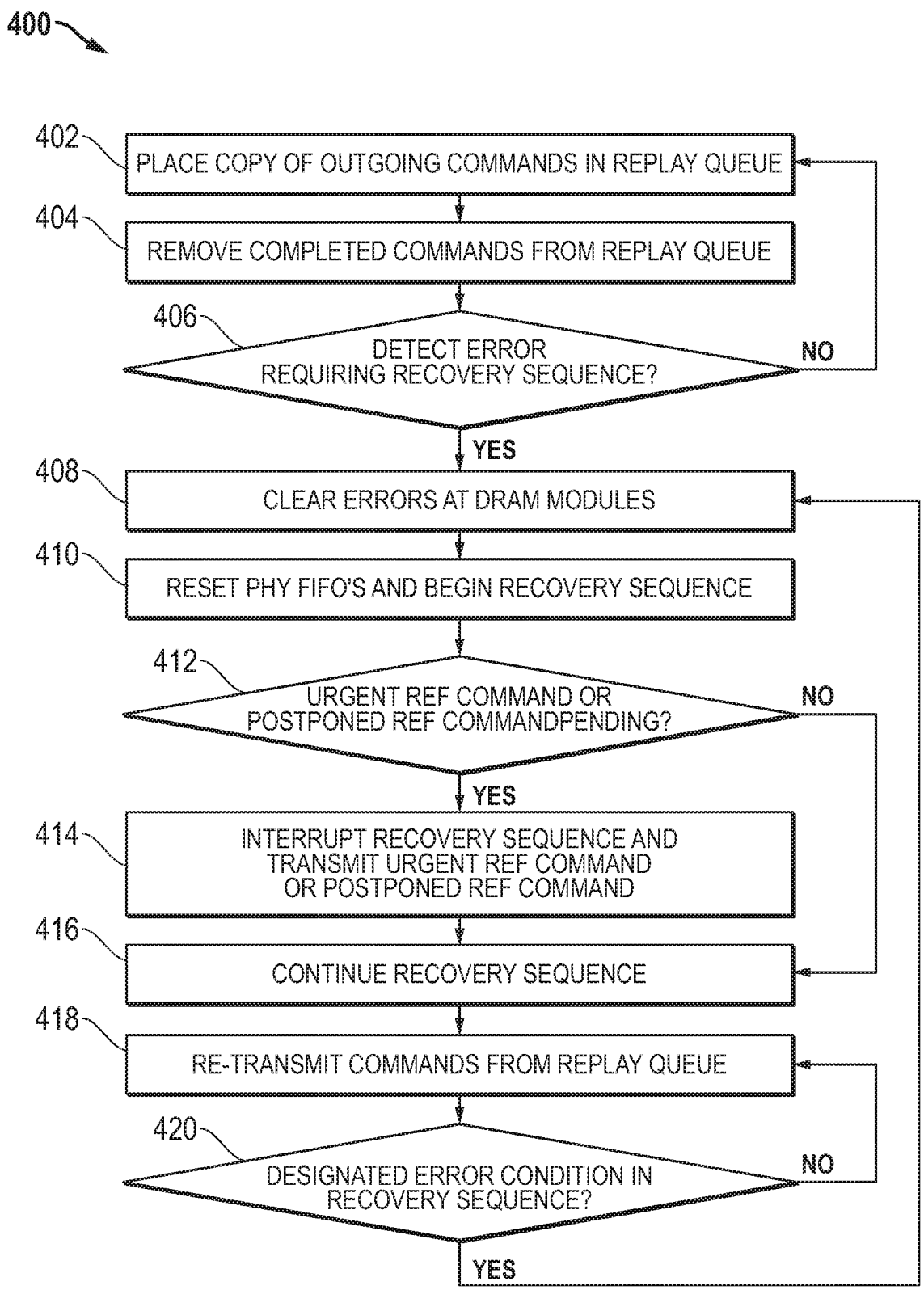
FIG. 4 is a flow diagram of a process for replaying commands according to some embodiments.

FIG. 4 is a flow diagram 400 of a process for replaying commands according to some embodiments. In the illustrated embodiment, the depicted process is managed by replay control logic 231 (FIG. 2) but in other embodiments, can be managed by another suitable digital logic circuit implementing the described functionality. The process begins at block 402 where copies of outgoing commands are placed in the replay queue (230, FIG. 2) to be saved until the commands are fulfilled without error. At block 404, when commands are fulfilled without error, they are removed from the replay queue. This sequence of placing commands in the replay queue until they are fulfilled continues until an error is detected requiring a recovery sequence, as shown at block 406.

The process at block 406 detects whether there was an error at one of the DRAM modules (e.g., DIMMs) or on the memory channel which requires a recovery sequence. When such an error is detected, the process goes from block 406 to block 408, where it clears errors at the DRAM module(s). Block 408 includes clearing parity errors at each DRAM module on the memory channel if a parity error was detected. If a write or read ECC error was detected at block 406, block 408 clears the write or read ECC status. In some embodiments, if the process is unable to determine an error type, it clears errors for both error types to ensure the error status is completely cleared.

At block 410, the memory controller resets the first-in-first-out (FIFO) buffers of the PHY at block. If Multi-Purpose Register (MPR) mode is currently active, it is disabled before the reset. Block 410 may also include requesting write credits if they are needed. If the MPR mode was active prior to the recovery sequence, it is then enabled again in order to place the DIMM in the same condition it was in when the error occurred to replay the necessary commands. At this point the recovery sequence has reset and cleared the various parts of the channel and DIMM. However, before sending commands to implement the recovery sequence, which ties up the command bus for a time, the process handles refresh commands in order to avoid violating restrictions on the maximum time between REF commands, and to handle RFM commands which may have been generated for particular regions based on counting activate commands.

To handle such commands, the process at block 412 checks if an urgent refresh or a postponed refresh command is pending before it re-transmits commands in the recovery sequence. An urgent refresh command in this embodiment is any of the REF or RFM commands generated or prioritized by the refresh management process of FIG. 3 (such as at block 312, block 320, and block 328). Other embodiments use other processes than that of FIG. 3 to provide an urgent refresh command. For example, an urgent refresh command in some embodiments is a REF or RFM command generated in response to an undesired value at an activate counter for a memory region such as a bank, sub-bank, or line. Still other embodiments may not use an activate counter to generate urgent refresh commands, but instead monitor refresh conditions created by the underlying periodic refresh cycle, and interject urgent refresh commands where needed. The refresh control circuit includes an output, or a flag or similar indictor, which signals to arbiter 238 (FIG. 2) and replay control circuitry 231 that a particular refresh command is urgent. Typically, this signal indicates that the command must be sent before any further activate commands are sent to the affected memory region. A postponed refresh command is an REF command pending that is postponed such that the maximum REF to REF interval for a memory region might be violated if the recovery cycles lasts too long. For example, some DDR standards provide a maximum interval between refreshes of 5 times a defined time interval tREF1.

If an urgent refresh command or postponed refresh command is present at block 412, the process interrupts the recovery sequence at block 414 and allows the arbiter to transmit the urgent refresh command and/or postponed refresh command. Multiple refresh commands may be transmitted at this block for different memory regions. If no urgent refresh command is pending at block 412, the process goes directly to block 416 to continue the recovery sequence.

Next, at block 418, the process replays commands starting with selected commands from the replay queue. Typically the commands are replayed in the exact order they were first transmitted. Replayed commands are placed in the memory interface queue for transmission to DRAM. In some embodiments, the selected commands include any reads, writes, and MPR-related commands. As the recovery sequence replays commands, at block 420 the process monitors for errors. If an error message is received during the recovery sequence, the process at block 420 determines if the error is of a designated type that would require the recovery sequence to be restarted. For example, a command parity error requires a restart of the recovery sequence in this embodiment. Other types of errors may also meet the designated conditions. If the error condition does not meet the designated conditions, the process at block 420 returns to block 418 and continues re-transmitting commands in the recovery sequence.

If a designated error condition is present at block 420, it represents a second or further error in addition to the original error detected at block 406. This additional error results in a "recursive" recovery sequence, in which the recovery sequence restarts. In some scenarios, such a restart can cause the refresh management process to lag behind in providing appropriate refresh commands. In some scenarios, the recovery sequence may have to restart more than once if errors occur before all the commands in the replay queue are transmitted. The depicted process checks for urgent refresh commands and postponed refresh commands (block 412) each time a recovery sequence is restarted. When transmission of all the commands in the replay queue is completed and the commands are fulfilled, the recovery sequence is considered complete and the memory controller ends the recovery sequence and returns to its normal operating conditions with the arbiter selecting commands to be transmitted.

Figure 5:
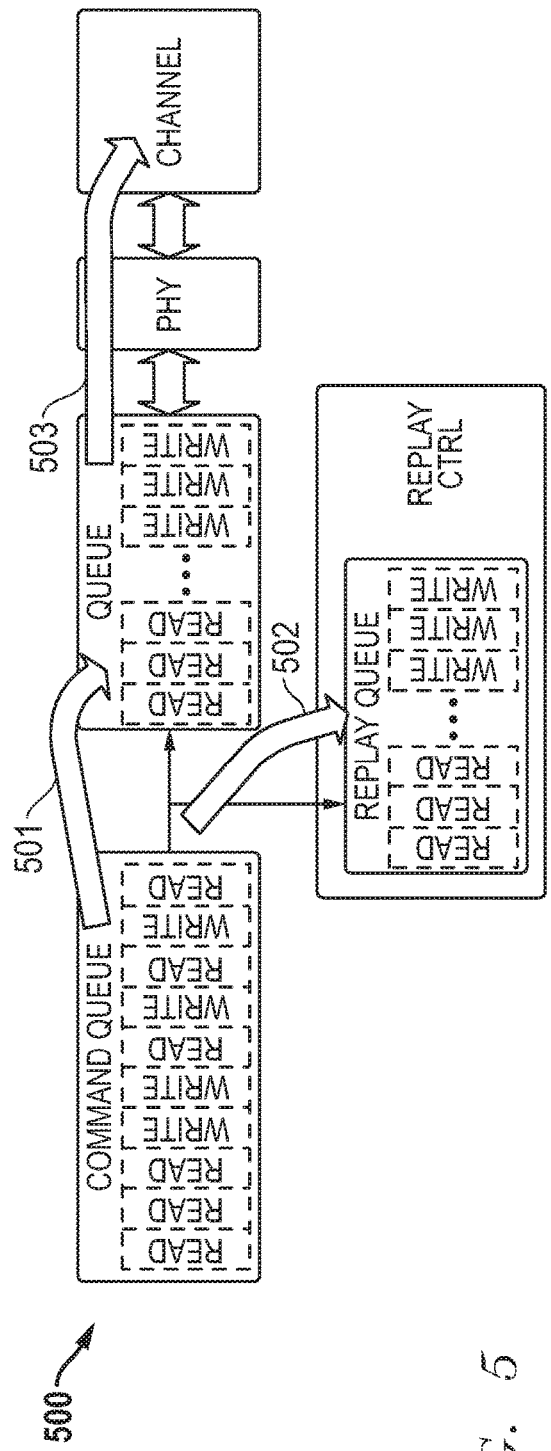
FIGS. 5-7 are a series of diagrams illustrating parts of a recovery sequence according to some embodiments.
Figure 6:
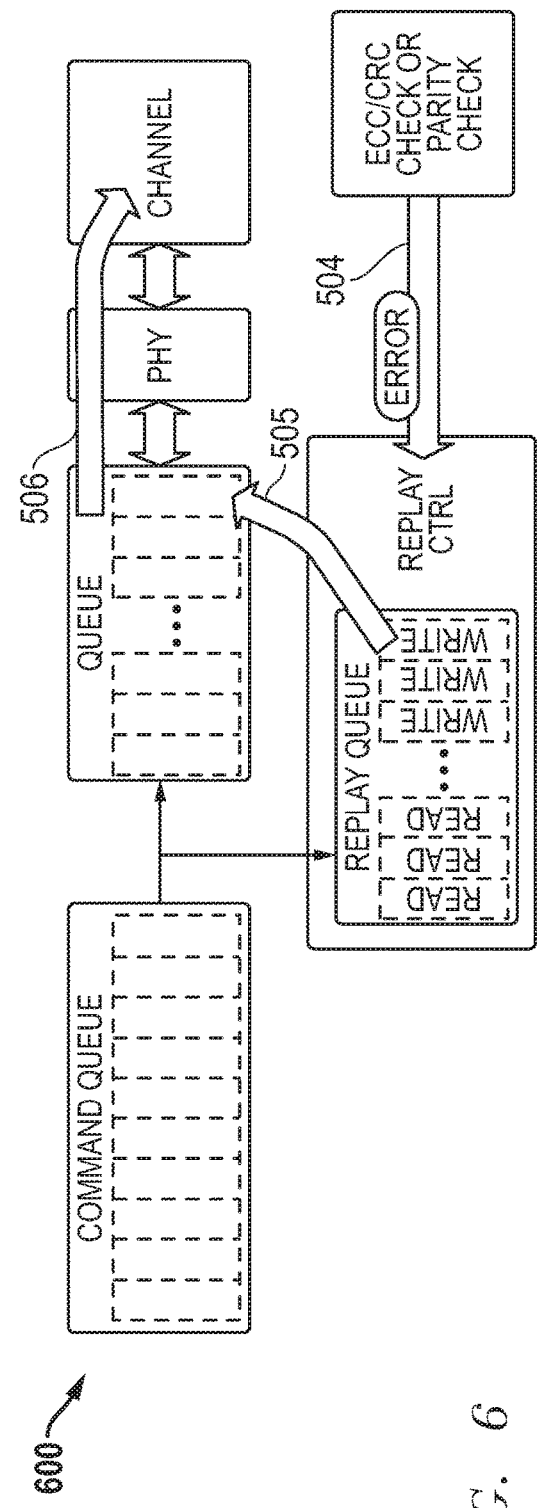
Figure 7:
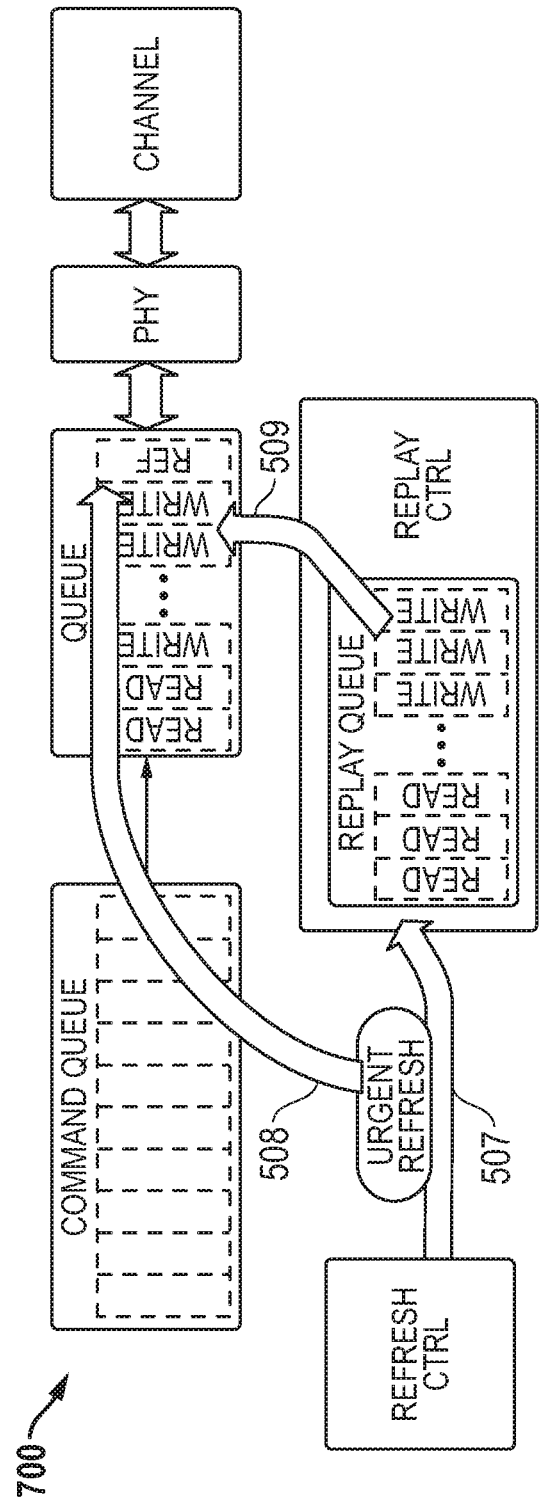

FIGS. 5-7 are a series of diagrams illustrating parts of a recovery sequence according to some embodiments. FIG. 5 is a diagram 500 illustrating an example scenario before a recovery sequence begins. An arbiter such as arbiter 238 (FIG. 2) selects incoming commands from the command queue for placement in the memory interface queue ("QUEUE" in FIG. 5). This operation is depicted by arrow 501 showing commands placed in the QUEUE in an order selected by the arbiter. Arrow 502 depicts a copy of the commands being placed in the replay queue. Arrow 503 depicts the commands transmitted from the QUEUE over the PHY layer and the memory channel to the DRAM module.

FIG. 6 is a diagram 600 showing the scenario of FIG. 5 continuing with arrow 504 indicating an error message is indicating an error, such as a command parity error or an ECC or CRC check error indicating an uncorrectable error, has occurred over the channel. This causes the recovery sequence to start as discussed above. Commands from the replay queue are then replayed in order as depicted by arrow 505 showing commands from the replay queue added to the QUEUE. These commands are then transmitted over the channel as indicated by arrow 506.

FIG. 7 is a diagram 700 showing a later scenario in which a designated error condition has occurred during a recovery sequence requiring a restart of the recovery sequence. At the restart, an urgent refresh command is present to be transmitted as indicated by arrow 507. Before commands in the restarted recovery sequence are transmitted, the urgent refresh command is placed in the QUEUE to be transmitted, as illustrated by arrow 508. Then the commands in the replay queue are added to the QUEUE for transmission as indicated by arrow 509.

While in this embodiment an urgent refresh command is able to be transmitted when error conditions require the recovery sequence to restart, in other embodiments the check for an urgent refresh command (block 412, FIG. 4) may be performed at additional points in the process, or other points in the process. For example, the check may occur at the beginning of a recovery sequence, or if the replay queue is large enough to warrant further checks, periodic checks for an urgent refresh may occur during the recovery sequence without an error condition like that of block 420.

Memory controller 200 of FIG. 2 or any portions thereof, such as arbiter 238 and refresh control circuit 232, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides DDRx, such as high bandwidth memory (HBM), RAMbus DRAM (RDRAM), and the like. While the illustrated embodiment showed each rank of memory corresponding to separate DIMMs or SIMMs, in other embodiments each module can support multiple ranks. Still other embodiments may include other types of DRAM modules or DRAMs not contained in a particular module, such as DRAMs mounted to the host motherboard. Accordingly, it is intended by the appended claims to cover all modifications of the disclosed embodiments that fall within the scope of the disclosed embodiments.

What is claimed is:

1. A memory controller, comprising:
   an arbiter for selecting memory commands and causing them to be transmitted over a memory channel; and
   at least one replay queue storing memory access commands that are transmitted over the memory channel; and
   a refresh control circuit coupled to the arbiter and operable to monitor an activate counter which counts a number of activate commands sent over the memory channel to a memory region, and in response to the activate counter being above a designated threshold, signal the arbiter that an urgent refresh command should be sent; and
   a replay control circuit for detecting that a designated type of error has occurred, and in response to the error, initiating a recovery sequence including re-transmitting selected memory commands from the at least one replay queue, wherein the replay control circuit is further operable for, in response to designated error conditions in the recovery sequence, based on whether an urgent refresh command is pending at the arbiter, interrupting the recovery sequence and allowing the urgent refresh command to be sent.

2. The memory controller of claim 1, wherein the replay control circuit is further operable for causing the refresh control circuit to increment the activate counter in response to an error in transmitting a refresh command.

3. The memory controller of claim 1, wherein the designated error conditions include a command parity error during the recovery sequence.

4. The memory controller of claim 1, wherein the designated error conditions include a restart of the recovery sequence.

5. The memory controller of claim 1, wherein the designated error conditions include at least a partial repeat of the recovery sequence.

6. The memory controller of claim 1, wherein the urgent refresh command is one of a refresh (REF) for at least a portion of the memory region, or a refresh management command (RFM) for the memory region.

7. The memory controller of claim 1, where the memory region is one of a memory bank and a sub-bank.

8. The memory controller of claim 7, wherein when the memory region is a sub-bank of a memory bank, the refresh control circuit is operable to monitor multiple activate counters for respective multiple sub-banks of the memory bank.

9. The memory controller of claim 7, wherein the replay control circuit is operable to replace an REF command for a designated sub-bank with an REF command for the memory bank containing the designated sub-bank.

10. The memory controller of claim 1, wherein the refresh control circuit is further operable to decrement the activate counter by a first designated amount if an REF command issues to the memory region.

11. A method, comprising:
    selectively transmitting the memory commands to a memory channel coupled to at least one dynamic random access memory (DRAM), and storing a copy of the transmitted memory commands in a replay queue;
    counting a number of activate commands sent over the memory channel to a memory region of the DRAM;
    in response to the number of activate commands being above a designated threshold value, signaling an arbiter that an urgent refresh command should be sent to the memory region;
    detecting that a designated type of error has occurred, and in response to the error, initiating a recovery sequence including re-transmitting selected memory commands from the replay queue; and
    in response to designated error conditions in the recovery sequence, checking whether an urgent refresh command is pending at the arbiter and, and, if so, interrupting the recovery sequence and allowing the urgent refresh command to be sent.

12. The method of claim 11, further comprising incrementing a count of activate commands in response to an error in transmitting a refresh command.

13. The method of claim 11, wherein the designated error conditions include a command parity error during the recovery sequence.

14. The method of claim 11, wherein the designated error conditions include a restart of the recovery sequence.

15. The method of claim 11, wherein the designated error conditions include at least a partial repeat of the recovery sequence.

16. The method of claim 11, wherein the urgent refresh command is one of a refresh (REF) for at least a portion of the memory region, and a refresh management command (RFM) for the memory region.

17. The method of claim 11, where the memory region is one of a memory bank and a sub-bank.

18. The method of claim 17, wherein when the memory region is a sub-bank of a memory bank, the method further comprises monitoring multiple activate counters for respective multiple sub-banks of the memory bank.

19. The method of claim 18, further comprising replacing an REF command for a designated sub-bank with an REF command for the memory bank containing the designated sub-bank.

20. The method of claim 11, further comprising decrementing a count of activate commands by a first designated amount if an REF command issues to the memory region.

21. A data processing system, comprising:
    a data processor;
    a memory controller for fulfilling memory requests from data processor, the memory controller comprising:
       an arbiter for selecting memory commands and causing them to be transmitted over a memory channel; and
       at least one replay queue storing memory commands that are placed in the memory interface queue; and
       a refresh control circuit coupled to the arbiter and operable to monitor an activate counter which counts a number of activate commands sent over the memory channel to a memory region, and in response to the activate counter being above a designated threshold, signal the arbiter that an urgent refresh command should be sent; and a replay control circuit for detecting that a designated type of error has occurred, and in response to the error, initiating a recovery sequence including re-transmitting selected memory commands from the at least one replay queue, wherein the replay control circuit is further operable for, in response to designated error conditions in the recovery sequence, based on whether an urgent refresh command is pending at the arbiter and, interrupting the recovery sequence and allowing the urgent refresh command to be sent.

22. The data processing system of claim 21, wherein the replay control circuit is further operable for causing the refresh control circuit to increment the activate counter in response to an error in transmitting a refresh command.

23. The data processing system of claim 21, wherein the designated error conditions include a command parity error during the recovery sequence.

24. The data processing system of claim 21, wherein the designated error conditions include a restart of the recovery sequence.

25. The data processing system of claim 21, wherein the designated error conditions include at least a partial repeat of the recovery sequence.

26. The data processing system of claim 21, wherein the urgent refresh command is one of a refresh (REF) for at least a portion of the memory region, and a refresh management command (RFM) for the memory region.

27. The data processing system of claim 21, where the memory region is one of a memory bank and a sub-bank.

28. The data processing system of claim 27, wherein when the memory region is a sub-bank of a memory bank, the refresh control circuit is operable to monitor multiple activate counters for respective multiple sub-banks of the memory bank.

29. The data processing system of claim 28, wherein the replay control circuit is operable to replace an REF command for a designated sub-bank with an REF command for the memory bank containing the designated sub-bank.

30. The data processing system of claim 21, wherein the refresh control circuit is further operable to decrement the activate counter by a first designated amount if an REF command issues to the memory region.

* * * * *